United States Patent
Pettit

(10) Patent No.: US 8,013,359 B2
(45) Date of Patent: Sep. 6, 2011

(54) OPTICALLY CONTROLLED ELECTRICAL SWITCHING DEVICE BASED ON WIDE BANDGAP SEMICONDUCTORS

(75) Inventor: John W. Pettit, Rockville, MD (US)

(73) Assignee: John W. Pettit, Rockville, MD (US)

( * ) Notice: Subject to any disclaimer, the term of this patent is extended or adjusted under 35 U.S.C. 154(b) by 0 days.

(21) Appl. No.: 11/024,410

(22) Filed: Dec. 30, 2004

(65) Prior Publication Data
US 2006/0054922 A1    Mar. 16, 2006

Related U.S. Application Data

(60) Provisional application No. 60/533,151, filed on Dec. 31, 2003.

(51) Int. Cl.
*H01L 31/111* (2006.01)
(52) U.S. Cl. ...................................................... 257/116
(58) Field of Classification Search .................. 257/113, 257/686, 290, 116, 431, 462, E51.04, E31.053, 257/81, 82, 91, 98–100, 197, 117, 432–437, 257/457, 459, 749, E33.056–E33.059, E25.032, 257/E27.015, E27.017, E27.03–E27.032, 257/E27.109, E29.194–E29.225, 163–166, 257/205, 273, 351, 361, 378, 423, 427, 474, 257/477, 517, 526, 539, 544, 565–593, 928, 257/E51.004, E31.069; 257/E27.019–E27.023, 257/E27.037–E27.043, E27.053–E27.058, 257/E27.074–E27.078, E27.106, E27.149, 257/E29.03–E29.035, E29.044–E29.045, 257/E29.114, E27.124, E29.027–E29.028, 257/E29.066–E29.067, E21.382–E21.385, 257/E21.608–E21.613, E27.052, E27.079, 257/E29.036–E29.038, E29.046–E29.048, 257/E29.115; 257/E21.388–E21.383, E21.614, 257/E21.677, 135–136, 242, 392, E27.091, 257/E27.095–E27.096, E29.118, E29.274, 257/E29.313, E29.318, E29.262; 209/579; 438/82, 682, 20, 202–208, 234–239, 170, 438/189, 309–378, 149, 163, 16, 31, 35, 438/25–28

See application file for complete search history.

(56) References Cited

U.S. PATENT DOCUMENTS

| | | | |
|---|---|---|---|
| 3,663,838 A | | 5/1972 | Reimers |
| 4,803,359 A | * | 2/1989 | Hosoi et al. ................... 250/586 |
| 4,933,731 A | * | 6/1990 | Kimura ........................ 257/438 |

(Continued)

FOREIGN PATENT DOCUMENTS
WO    WO-2007/002603 A2    1/2007

OTHER PUBLICATIONS

Rotkin, Theory of Nanotube Opto-electromechanical Device, Proceeding of Third IEEE conference on Nanotechnology, Aug. 12-14, 2003. Moscone Convention Center, San-Francisco, CA. vol. 2, pp. 631-634.*

(Continued)

*Primary Examiner* — Dao H Nguyen
*Assistant Examiner* — Tram H Nguyen
(74) *Attorney, Agent, or Firm* — Blank Rome LLP

(57) ABSTRACT

A power switching device includes an optically controlled component using a semiconducting carbon nanotube. An optical signal transmitted over an optical fiber controls the conductivity of the nanotube. The nanotube transmits a signal controlled by the optical signal to a wide-bandgap semiconductor power switch, which switches the power.

13 Claims, 2 Drawing Sheets

U.S. PATENT DOCUMENTS

| | | | |
|---|---|---|---|
| 6,218,682 B1* | 4/2001 | Zucker et al. | 257/113 |
| 6,774,333 B2* | 8/2004 | Hannah | 209/579 |
| 6,955,939 B1* | 10/2005 | Lyons et al. | 438/82 |
| 2002/0001905 A1 | 1/2002 | Choi et al. | |
| 2003/0186167 A1* | 10/2003 | Johnson, Jr. et al. | 430/296 |
| 2003/0214054 A1* | 11/2003 | Awano et al. | 257/797 |
| 2003/0226996 A1* | 12/2003 | Aramaki et al. | 252/62.3 Q |
| 2004/0142560 A1* | 7/2004 | Kuo et al. | 438/682 |
| 2005/0093425 A1* | 5/2005 | Sugiyama | 313/495 |
| 2006/0261876 A1 | 11/2006 | Agarwal et al. | |

OTHER PUBLICATIONS

Rotkin, "Theory of Nanotube Opto-electromechanical Device", Proceedings of Third IEEE conference on Nanotechnology, Aug. 12-14, 2003. Moscone Convention Center, San-Francisco, CA. vol. 2, pp. 631-634.*

Rotkin et al., "Nanotube Light-Controlled Electronic Switch", S. Rotkin, et al., International Journal of Nanoscience, vol. 1, Nos. 3 and 4 (2002), pp. 347-355.*

"Switching Behavior of Semiconducting Carbon Nanotubes Under an External Electric Field", A. Rochefort, et al., Applied Physics Letters, vol. 78, No. 17, Apr. 23, 2001, pp. 2521-2523.

"High Performance Electrolyte-Gated Carbon Nanotube Transistors", S. Rosenblatt, et al., pp. 1-12.

Carbon Nanotube Chemical and Mechanical Sensors:, S. Peng, et al., Conference Paper for $3^{rd}$ International Workshop on Structural Health Monitoring, pp. 1-8.

"Quantitative Analysis of Optical Spectra from Individual Single-Wall Carbon Nanotubes", A. Hagen, et al., Dept. of Physical Chemistry, Germany, Nano Letters in Press, pp. 1-6.

"Variable and Reversible Quantum Structures on a Single Carbon Nanotube", C. Kilic, et al., Nov. 17, 2000, pp. 1-7.

"Fullerene Nanotubes in Electric Fields", L. Lou, et al., Physical Review B, vol. 52, No. 3, Jul. 15, 1995.

"Reversible Band Gap Engineering in Carbon Nanotubes by Radial Deformation", O. Gulseren, et al., Mar. 11, 2002, pp. 1-8.

"Nano Electro Mechanics of Semiconducting Carbon Nanotube", S. Peng, et al., Journal of Applied Mechanics, Jul. 2002, vol. 69, pp. 451-453.

R. F. Carson et al, "Optically-triggered GaAs thyristor switches: integrated structures for environmental hardening," Sandia National Laboratories, SAND-90-0736C, filmed Nov. 13, 1990.

"Pressure Dependence of Optical Transitions in Semiconducting Single-Walled Carbon Nanotubes", W. Shan, et al., Phys. Stat. Sol. (b) 241, No. 14, Oct. 27, 2004, pp. 3367-3373.

"Nanotube Light-Controlled Electronic Switch", S. Rotkin, et al., International Journal of Nanoscience, vol. 1, Nos. 3 and 4 (2002), pp. 347-355.

Band Gap Fluorescence from Individual Single-Walled Carbon Nanotubes, M. O'Connell, et al., Science, vol. 297, Jul. 26, 2002, pp. 593-596.

"Electrically Induced Optical Emission from a Carbon Nanotube FET", J. Misewich, et al., Science, vol. 300, May 2, 2003, pp. 783-786.

"Interactions Between Conjugated Polymers and Single-Walled Carbon Nanotubes", D. Steuerman, et al., J. Phys. Chem., B 2002, 106, pp. 3124-3130.

"Functionalized Surfaces Based on Polymers and Carbon Nanotubes for Some Biomedical and Optoelectronic Applications", L. Dai, et al., Institute of Physics Publishing, Nanotechnology 14 (2003), pp. 1081-1097.

"Nanotube Optoelecronic Memory Devices", A. Star, et al., American Chemical Society, 2004, Nano Letters, vol. 4, No. 9, pp. 1587-1591.

"Estraordinary Mobility in Semiconducting Carbon Nanotubes", T. Durkop, et al., American Chemical Society, 2004, Nano Letters, vol. 4, No. 1, pp. 35-39.

"Water-Soluble and Optically pH-Sensitive Single-Walled Carbon Nanotubes from Surface Modification", W. Zhao, et al., J. Am. Chem. Soc., 2002, pp. 12418-12419.

Marc Bockrath, et al., "Chemical doping of individual semiconducting carbon-nanotube ropes", Rapid Communications, Physical Review B, vol. 61, No. 16, Apr. 15, 2000-II, pp. 606-608.

John Pettit, "EMI Immunity and Induced Polarization of Carbon Nanotubes," report. May 31, 2006.

* cited by examiner

OPTICALLY CONTROLLED ELECTRICAL SWITCHING DEVICE BASED ON WIDE BANDGAP SEMICONDUCTORS

REFERENCE TO RELATED APPLICATION

The present application claims the benefit of U.S. Provisional Patent Application No. 60/533,151, filed Dec. 31, 2003, whose disclosure is hereby incorporated by reference into the present disclosure.

FIELD OF THE INVENTION

The present invention is directed to an optically controlled switching device and more particularly to such a device which exploits the advantages of wide bandgap (WBG) semiconductors.

DESCRIPTION OF RELATED ART

Power switching devices are reaching fundamental limits imposed by the low breakdown field of silicon, and substantial improvements can only be achieved by going to semiconductors with a higher breakdown field. Wide bandgap semiconductors, such as silicon carbide, SiC, have a bandgap of around 3 eV and 8 times the breakdown voltage and 100-200 times the on state conductivity of silicon. SiC can work at temperatures of 600 degrees Centigrade, has much better thermal conductivity than silicon, has a coefficient of thermal expansion that is nearly matched to preferred substrate materials and forms an insulating oxide that allows for device fabrication.

Wide bandgap materials are semiconductors, just like silicon, but they feature a much wider forbidden energy region or bandgap than silicon does. Although the dividing line between the conventional semiconductors and wide bandgaps is not rigid, materials with a bandgap of around or above 3 eV clearly belong into this category. Some examples of these materials are: silicon carbide (SiC), gallium nitride (GaN), boron nitride (BN), diamond (C), and aluminum nitride (AlN). Wide bandgap semiconductors are used in extreme electronic and opto-electronic applications.

Wide bandgap semiconductor materials have remarkable potential for utilization in device applications. Diamond, Silicon Carbide, and the group-III nitrides are currently being probed from many different perspectives. Gallium Nitride, Indium Nitride, and Aluminum Nitride have direct transitions and hence hold greater promise as optoelectronic materials than the others. High working-temperature and radiation-hard electronic devices, high-power high-frequency microwave devices, UV and blue-green laser diodes and LEDs, and solar blind detectors are some of the possibilities.

Silicon carbide (SiC) and gallium nitride (GaN) are wide bandgap semiconductors (WBG) that have been the focus of research for over 30 years for applications ranging from high power electronics and high frequency amplifiers to short wavelength emitters and solid-state lighting. While the inherent properties of these materials give them dramatic performance advantages over conventional semiconductors (e.g., Si and GaAs), the materials' quality and application markets have not been sufficiently mature until recently to justify significant manufacturing activities.

Of the two families, SiC is the most mature and the closest to practical device implementation. SiC is unique among compound semiconductors in that its native oxide is $SiO_2$, the same oxide as silicon. This means that the workhorse power devices used in silicon, i.e. the power MOSFET, insulated gate bipolar transistor (IGBT), and MOS-controlled thyristor (MCT) can all be fabricated in SiC. However, because of technological differences, power devices in SiC will be very different from silicon devices, and a direct translation of silicon concepts to SiC is not always possible. SiC has a breakdown field 8× higher than that of silicon, and SiC power devices can have specific on-resistances 100-200× lower than similar devices in silicon.

The compounds GaN and AlGaN have high breakdown field and high carrier mobility, and would appear to be ideally suited for power device implementation. However, these III-V nitride compounds do not possess a native oxide similar to $SiO_2$, so true MOS devices will not be feasible. In addition, the nitrides suffer from the lack of a suitable lattice-matched substrate for crystal growth, and hence the material is in a more primitive state of development than SiC.

Wide band gap semiconductor devices accomplish tasks silicon devices cannot, due to a basic difference in physical structure. Other applications for the new blue spectrum LEDs and laser diodes that are just now moving from development into manufacturing will be as holographic memories and in compact discs which are being used as upgrades for telecommunication switches, in data communication networks, as optical storage, and in various identification markets, including bar code scanning, sensing, and Digital Video Disc (DVD) applications.

In general, compound semiconductors can operate more efficiently and more effectively than silicon in applications requiring the transmission of light, in microwave and millimeter wave applications, and in especially harsh environments, such as the cold temperature and high radiation environment of outer space. Devices made from other compound semiconductor materials can operate directly in hot environments, such as in jet engines or down the holes of oil wells. Again, in general, compound semiconductors are remarkably small and have extraordinary capabilities. As a metric to help visualize how they are manufactured and how small they actually are, tens of thousands of VCSELs can now be efficiently fabricated on a 76-millimeter diameter wafer.

Electrical power switching devices have been traditionally built with silicon using SCR, IGBT, or MOSFET device structures. Furthermore, optically controlled devices have been built that use light to turn the devices on and off. Currently available optically controlled power switches in addition to being based on silicon and not offering the advantages of wide bandgap semiconductors, require an extremely large optical input signal to operate the device. This places an immense burden on the optical fiber that carries the light to the device and the optical power source that generates the required light. These factors add cost, complexity, and added waste heat generation to the system, which runs counter to the purpose of using these devices.

Wide bandgap semiconductors are very interesting to the military and aerospace industry for their power switching qualities that have been discussed, but with their large bandgap comes the requirement for even shorter wavelength light to cross this bandgap to optically activate these devices. Light of a wavelength necessary to activate wide bandgap semiconductors falls into the ultraviolet region of the electromagnetic spectrum, and light of this wavelength is not very good for fiber optic operation. Optical fibers simply do not transmit light at this wavelength very efficiently, and optical networks utilizing light at these wavelengths are not desired by the Air Force and the aerospace industry.

U.S. Pat. No. 6,218,682 B1 to Zucker et al teaches an optically controlled thyristor. However, a working device according to that patent would require more power than is desired in the art to be used. In turn, the power requirements would necessitate the use of enormous lasers and special-diameter optical fibers.

In a different field of endeavor, carbon nanotubes have remarkable electrical, structural and optical properties. They can be metallic, insulating or semi-conducting based on their diameter or "twist" and can be made to switch from one state to the other by a variety of means including doping, chemical bonding and adsorption, and mechanical strain. Carbon nanotubes can be made to selectively absorb or emit light at specific wavelengths. However, the art does not teach a way to combine the advantages of wide-bandgap semiconductors and carbon nanotubes or even the desirability of doing so.

SUMMARY OF THE INVENTION

It will be seen from the above that a need exists in the art for an improved power switching device which uses the advantages of wide bandgap semiconductors while overcoming their drawbacks.

It is therefore an object of the invention to provide an optically controlled electric power switch suitable for power control for motors and actuators and other devices requiring the control of electrical power to be used on, for instance, aircraft and numerous types of vehicles.

It is another object of the invention to provide, at least in some embodiments, an optically controlled power switch whose optical interface is a optical fiber cable and furthermore operates in a fiber optic network and in particular a wavelength division multiplexing (WDM) optical network It is still another object of the present invention to provide, at least in some embodiments, an electric power switch that is optically controlled where the optical power levels are within the range that can be supplied through a single channel of an optical network, typically provided by a small laser light source termed a VCSEL, or vertical cavity surface emitting laser, whose output is in the range of a milliwatt.

It is still another object of the invention to provide, at least in some embodiments, an optically controlled switch where carbon nanotubes provide the optical interface to the power switching element, which can be a bipolar transistor, a power FET, an IGBT or similar device including SCR or Triac, or a large number of carbon nanotubes operating in parallel that carry the switched current through them.

It is still another object of the invention to provide, at least in some embodiments, an optically controlled device where the power switching element is a wide bandgap semiconductor, such as Silicon Carbide SiC, Gallium Nitrate GaN, and others.

It is still another object of the invention to provide, at least in some embodiments, an optically controlled power switch that can operate at high temperatures and harsh environments useful for aerospace, defense and similar hostile environments.

It is still another object of the invention to provide, at least in some embodiments, an optically controlled switch where a material converts applied light into a charge that is directed to carbon nanotubes and causes the nanotube's electrical conductivity to be manipulated, so as to be able to switch or bias the main power switching device. The optical material may be the substrate upon which the nanotube is placed or it may be a coating of some photoconductive material or it may be a photosensitive polymer. The material my be in physical close contact with the nanotube or it may be chemically bonded to the nanotube such as through a covalent bond of a photoconductive polymer to the nanotube.

It is still another object of the invention to provide, at least in some embodiments, an optically controlled power switch that is immune to very large values of electromagnetic interference, EMI, on the order of millions to even hundreds or possibly thousands of millions of volts per meter of electric field strength. This property of carbon nanotubes is very important for military and even commercial aerospace applications.

To achieve the above and other objects, the present invention is directed to a power switch combining a semiconductive carbon nanotube component and a semiconductor component, which in the preferred embodiment is a wide-bandgap semiconductor component but can alternatively be a conventional semiconductor component. The carbon nanotube component is connected to the wide-bandgap semiconductor component, e.g., at the gate of the wide-bandgap semiconductor component, so that a signal passing through the carbon nanotube component controls the power switching of the wide-bandgap semiconductor component. An optical signal applied to the carbon nanotube component affects its conductivity and thus the signal applied to the gate of the wide-bandgap semiconductor component.

The present invention takes advantage of the properties to allow carbon nanotubes to control the electrical switching of wide bandgap semiconductor switching devices through optical actuation compatible with fiber optic wavelength division multiplexing, WDM, networks.

Devices envisioned will be able to switch more than 150 amperes on the command of optical signals received through an optical fiber at specific optical wavelengths. This will permit power control of motors, actuators, weapon systems, radar, sonar and other high power applications through totally optical WDM networks. Higher efficiencies, through better thermal and electrical switching properties, will make more effective power management possible, reduce waste heat loads, and operation at much higher temperatures possible. The "all electric" air, sea or land vehicle that does not rely on hydraulic means to deliver power will be greatly benefited from this technology.

These new devices will achieve significantly higher performance than their silicon based predecessors and will be optically controlled and totally compatible with WDM networks as well as Air Force "fly-by-light" requirements.

A goal of the invention is to overcome these problems and offer the advantages of high switching efficiency and improved thermal properties that wide bandgap semiconductors have the potential to deliver.

In addition to the better electrical properties already mentioned for wide bandgap semiconductors in general, the material used in at least one embodiment, silicon carbide (SiC), has substantially better thermal properties and dimensional stability. The improved thermal properties allow better dissipation of waste heat, which is critical to power switching components. Better dimensional stability properties make SiC much more compatible with substrate characteristics for bonding and packaging to achieve longer lifetime and greater reliability.

The present invention uses carbon nanotubes to enhance the optical control function. These improvements will allow the device to switch large amounts of electrical current with light levels that can be provided through single or multimode optical fibers in proposed WDM systems. A single WDM channel with characteristics no different from the other channels will be able to operate these new devices. The basic concept is to use the unique optical absorption, bandgap control, and electrical transport properties of carbon nanotubes to provide the means to switch the devices.

The present invention uses the properties of carbon nanotubes as a means of optically controlling an electrical power switching device such as an isolated gate bipolar transistor, or IGBT. The preferred approach is to use the extraordinary electron mobility of single walled carbon nanotubes, which gives rise to the largest transistor transconductance values ever seen in an FET, in conjunction with the exquisite sensitivity of nanotubes to charge generated very near their surface as the enabling concepts for this new device. The charge near the surface of the nanotube is to be generated optically. This can be done through a few mechanisms. In one case this can be done by photon interaction with the silicon substrate that forms the gate of a nanotube FET. A preferred approach is to use a material that is chosen to optimally absorb the applied light and generate charge with adequate speed and mobility near the carbon nanotube surface. This material will be physically coated around the carbon nanotube or will be chemically linked to the nanotube so that charge transfer occurs.

By combining these phenomena, an electrical power switch will be created that is controlled by the light levels produced by VCSEL devices transmitted to the power switch over an optical fiber. Power switching levels and switching speeds needed to support the armature currents in electronic actuators for aircraft and other types of vehicles will be achieved.

These two critical concepts have already been demonstrated in the physics laboratories of nanotube researchers. Kazuhiko Matsumoto at Osaka University in Japan [Reference 1] has recently published a paper where he created a single electron nanotube FET and illuminated the silicon substrate with light. He measured the change in current through the nanotube FET and computed the sensitivity to be 160 times greater than any silicon photodiode ever made. Professor Michael Fuhrer at the University of Maryland, College Park, has made high performance nanotube FET's with the highest transistor transconductance ever seen for an FET [Reference 2].

A new type of optically controlled electrical power switching device based on carbon nanotubes can be made that offers unparalleled performance as well as immunity to high levels of EMI/RFI approaching and possibly exceeding 100 million volts per meter.

There are two main concepts that make this invention extremely important. First, semiconducting carbon nanotubes have been found to be extremely sensitive to charge acting very near the nanotube's surface. This effect is well known and has been the basis for predicting single molecule or single electron detection sensitivity for carbon nanotube based sensors for application such as biological detection or electronic nonvolatile memory devices. The extreme sensitivity of a carbon nanotube to charge acting very near its surface is being exploited to create a light activated FET where a very small amount of light is needed to make the carbon nanotube FET operate. This is very important for operation as an element in an optical network, such as the Air Force "Fly-by-Light" program for future aircraft. Present optically controlled power switching devices require many watts of optical power to switch, and this is not obtainable without extreme cost, weight, complexity and size in fiber optic systems. It is very desirable to be able to operate a power switch with the power available in a typical fiber optic channel in a wavelength division multiplexing, WDM, system. This type of system is planned to employ VCSEL, or vertical cavity surface emitting laser devices that generate only a milliwatt of light power. This is many orders of magnitude less than the light input requirements of optically controlled power switching devices currently being developed by other companies.

The second very important factor is that devices used in Air Force and commercial aerospace applications need to be able to withstand extremely large electromagnetic fields, EMI, on the order of millions of volts per meter. This is due to the future battlefield environments, the use of directed energy weapon systems and the threat of EMI bombs or weapons. In a rather sensitive, but unclassified report, aerospace engineers have determined that most commercial airplanes and many military airplanes can be brought down by relatively easy to achieve levels of EMI that can be generated by terrorists with crude devices. It is therefore a high priority for the military and the commercial aerospace industry to develop EMI immune and even EMI operable aircraft.

In several technical papers, one written by Professor Richard Smalley [Reference 3], 1996 Nobel Prize winner for his discovery of means to produce large yields of semicoinducting carbon nanotubes, carbon nanotubes, even the semiconducting variety, were found to be essentially totally immune to externally generated electromagnetic fields, up to as much as hundreds or even thousands of millions of volts per meter.

This is an extraordinary paradox, which this invention exploits in a unique manner. The carbon nanotube FET is totally immune to external fields, making it meet Air Force EMI immunity goals, but extremely sensitive to very small amounts of charge active very close to its surface, making the device capable of switching with very low levels of light. The technical explanation for this fortuitous paradox has been explained in published carbon nanotube literature. It turns out that charge acting within approximately a nanotube's diameter distance away affects the nanotube through what has been termed the "quantum capacitance". The quantum capacitance has the ability to affect the Fermi level within the nanotube and either supply more electrons to the conduction band or deplete electrons from the conduction band of a semiconducting carbon nanotube. This makes the carbon nanotube's conductivity either increase or decrease by a large amount and gives rise to a high figure of merit FET action.

However, electric field generated externally is completely shunted by even semiconducting carbon nanotubes, and the carbon nanotubes behave as a perfect conductor in this case, making them effectively totally immune to externally generated electric fields. This effect has been reported by Professor Smalley, as mentioned above [Reference 3], and people such as Phadeon Avouris at IBM's T. J. Watson research center, manager of IBM's carbon nanotechnology research group [Reference 4]. Therefore, the combination of these two phenomena in this invention makes this invention extremely valuable to the Air Force and the aerospace industry.

There are many ways in which the charge can be generated that acts near the surface of the carbon nanotube. Photoconductive material may be placed around or in very close proximity, for instance through a very thin layer of a high "k" dielectric, to the nanotube. Alternatively, the charge can be generated by the absorption of light by a polymer material that is linked to the carbon nanotube such that charge transfer occurs. Published reports of photo-sensitive polymers that are carbon based with close chemical properties to carbon nanotubes indicate that such polymers have been covalently linked to the carbon nanotubes to create photo-activation of the carbon nanotubes. These means and similar techniques could be employed as various embodiments of this invention to achieve further goals, such as high temperature operation or manufacturing advantages.

In the preferred embodiment, the NPN and PNP transistors can be made with conventional silicon technology, or more advantageously with large bandgap semiconductors including silicon carbide, SiC, or other wide bandgap semiconductors. The advantages of these wide bandgap semiconductors are numerous in power control applications and furthermore in military and aerospace applications, where greater power control efficiency and high temperature operation is extremely desirable.

This leads to another large advantage of this invention, namely the operation of this invention in an optically activated mode with large bandgap semiconductors at elevated temperatures often found in aerospace applications at high speeds or near engine components. The carbon nanotube device of this invention permits the use of these very desirable wide bandgap semiconductors for electric power control, since the carbon nanotube creates the optical interface that switches the wide bandgap power switching device. The material that creates the charge acting on the carbon nanotube can be selected for operation at high temperature, and numerous materials may be selected for this purpose, as discussed above.

In summary, three compelling advantages of this invention are:

An optically controlled electrical power switch that operates with low levels of light that can be supplied in a typical fiber optic network;

Immunity to extremely large levels of electromagnetic interference, EMI; and

Operation with wide bandgap semiconductors to achieve high temperature operation and the enhanced efficiencies of wide bandgap semiconductors in a light controlled mode of operation.

The above-noted prior art relating to carbon nanotubes is described in the following publications, which are hereby incorporated by reference:
1. Kazuhiko Matsumoto, "Carbon Nanotube Single Electron Transistor with Ultra-High Sensitivity for Optical and Bio-Sensor", Osaka University ISIR, 8-1 Mihogaoka, Ibaraki-shi, Japan 567-0047; and
2. T. Durkop, S. A. Getty, Enrique Cobas and M. S. Fuhrer, "Extraordinary Mobility in Semiconducting Carbon Nanotubes", Nano Letters, Volume 4, Number 1, 2004, Pages 34-39.
3 L. Lou, P. Nordlander and R. E. Smalley "Fullerene nanotubes in electric fields", *Physical Review B*, Volume 52, Number 3, 15 Jul. 1995, pages 1429-1432
4 Alain Rochefort, Massimiliano Di Ventra, and Phadeon Avouris "Switching behavior of semiconducting carbon nanotubes under an external electric field", *Applied Physics Letters*, Volume 78, Number 17, 23 Apr. 2001, pages 2521-2523

BRIEF DESCRIPTION OF THE DRAWINGS

A preferred embodiment and variations thereon will be set forth in detail with reference to the drawings, in which.

DETAILED DESCRIPTION OF THE PREFERRED EMBODIMENT

Figure 1:
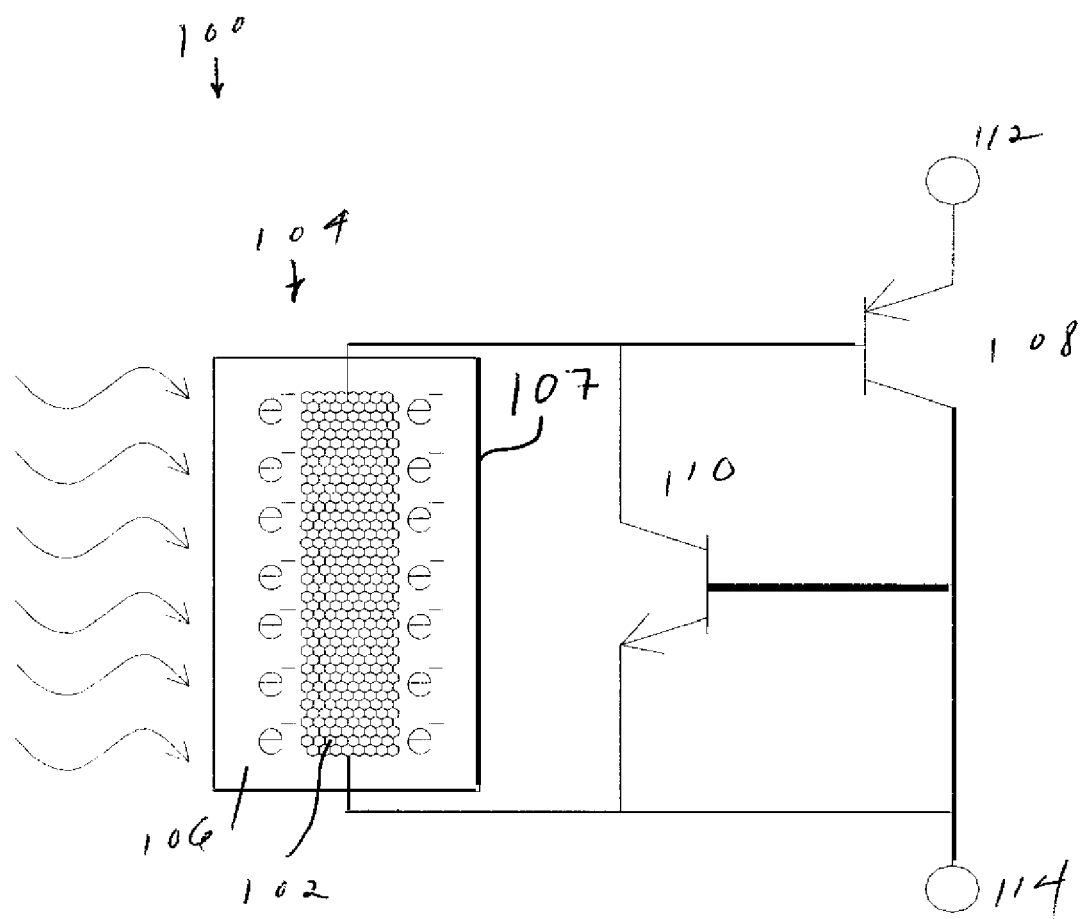
FIG. 1 is a circuit diagram showing a switching device according to the preferred embodiment.

A preferred embodiment will be set forth in detail with respect to the drawings, in which like reference numerals refer to like elements throughout.

FIG. 1 shows a preferred embodiment of the switching device as 100. One or more semiconducting carbon nanotubes 102 form an optically gated FET 104 that in turn gates or switches on a power switching device. The power switching device has the topology of an SCR or IGBT, although other topologies can be implemented. The carbon nanotube FET 104 takes the place of the MOS FET in a customary IGBT arrangement. The carbon nanotube FET 104 is optically activated by light that is supplied by an optical fiber or any such optical means that creates charge near the nanotube surface when the light interacts with the photo-generating material 106, which can include a semiconductor substrate 107 on which the carbon nanotube 102 is disposed, surrounding the carbon nanotube 102. This charge acting on the carbon nanotube surface is denoted by the $e^-$ symbols.

When the carbon nanotube 102 is made to conduct by the application of light, the carbon nanotube FET 104 passes a control signal which switches on the two transistor pair 108, 110 in the well known manner of an SCR, Triac or IGBT. To review this operation, the PNP transistor 108 at the rightmost side of the diagram, which is the main power pass transistor and is connected between the power terminals 112, 114, is made to conduct by the carbon nanotube 102 passing current through its base junction through the carbon nanotube FET 104. As this happens, the NPN transistor 110 in the middle is also made to conduct by current that passes through its base junction as the PNP transistor 108 begins to conduct. The NPN transistor 110 pulls current through its collector, which draws more current through the base junction of the PNP transistor 108, and the PNP transistor 108 is turned on even harder as a result. This is the well known regenerative effect of an SCR or IGBT, where a triggering signal, typically supplied by a MOS FET in the case of an IGBT or directly by a current pulse into the base of the PNP transistor in an SCR, causes the device to turn on an pass a large amount of current as a result of the interaction of the PNP-NPN transistor pair. The MOS FET usually found in the IGBT is replaced by a carbon nanotube optically gated FET 104 to achieve the same power switching effect.

Examples of the photo-generating material 106 will now be disclosed. Two such photosensitive materials are CdS and CdSe, which are well known photosensitive materials with good optical efficiencies as well as response times and are probably among the best choices. It is believed that the photo-generated charge from the CdS or CdSe acts through quantum capacitance to alter the Fermi level and thus to alter the conductivity of the carbon nanotube.

Another photo-generating technique which can be used in the present invention was disclosed at the American Physical Society annual meeting in March, 2004, in Montréal, Québec, Canada. In a presentation at that meeting by Matthew S. Marcus et al entitled "Photo-gated Carbon Nanotube FET Devices," the ability was disclosed to use visible light from a HeNe laser to gate a single walled carbon nanotube FET (CNTFET). The transistor devices were fabricated on $SiO_2$/p-Si substrates, where the p-Si was used as a gate for the nanotube channel. The light was absorbed not only by the carbon nanotube, producing photocurrents, but also in the silicon gate, which produced a photo-voltage at the interface between the Si and the $SiO_2$. Changes were observed in the channel current of up to 1 nA using light to photo gate the CNTFET.

Yet another possibility is the use of photosensitive polymers. A number of research papers have presented results and discussions of employing polymers with carbon nanotubes to create optoelectronic devices. Optically gated FET's and nonvolatile memory action have been demonstrated.

The polymers are typically wrapped around the carbon nanotube to functionalize the nanotubes, rather than covalently bonding to the nanotubes. The charge formed when the polymer absorbs light creates a photo-voltage near the nanotube surface and modifies the nanotube's conductivity in the way that has been described above. It has been discussed that this "wrapping" of the polymer around the nanotube has advantages over covalently linking the polymer to the nanotube, because the covalent linking chemically alters the nanotube structure.

Photo-polymers have interestingly large photon cross sections, and the presence of the nanotube tends to inhibit the emission of a luminescence photon to favor a charge transfer effect on the nanotube that gives rise to the modulation of the nanotube's conductivity. Rather large photo-electric gains have been reported for these polymer-carbon nanotube hybrid structures, on the order of $10^5$ electron increase in the nanotube conduction for every photon absorbed by the polymer.

Although this is very interesting, the charge mobility of this approach seems to be limited, and the response times of these devices have been reported to be on the order of seconds and even minutes. Much faster response times are needed for actuator use and in general for "Fly-by-Fiber" applications. These applications require at least tens of kilohertz and more likely hundreds of kilohertz and megahertz speed of operation. However, the advantages of polymer hybrids are such that they should be considered for applications for which the response time either is acceptable or can be improved to acceptable levels.

REFERENCES ON POLYMER

Carbon Nanotubes Hybrid Opto-electronic Structures

David W. Steuerman et. al. "Interactions between Conjugated Polymers and Single-Walled Carbon Nanotubes", Journal Physical Chemistry B 2002, 106, Pages 3124-3130.

Alexander Star et. al. "Nanotube Optoelectronic Memory Devices", Nano Letters 2004, Volume 4 Number 9, Pages 1587-1591.

Liming Dai et. al. "Functionalized surfaces based on polymers and carbon nanotubes for some biomedical and optoelectronic applications", Nanotechnology 14 (2003), Pages 1081-1097.

Figure 2:
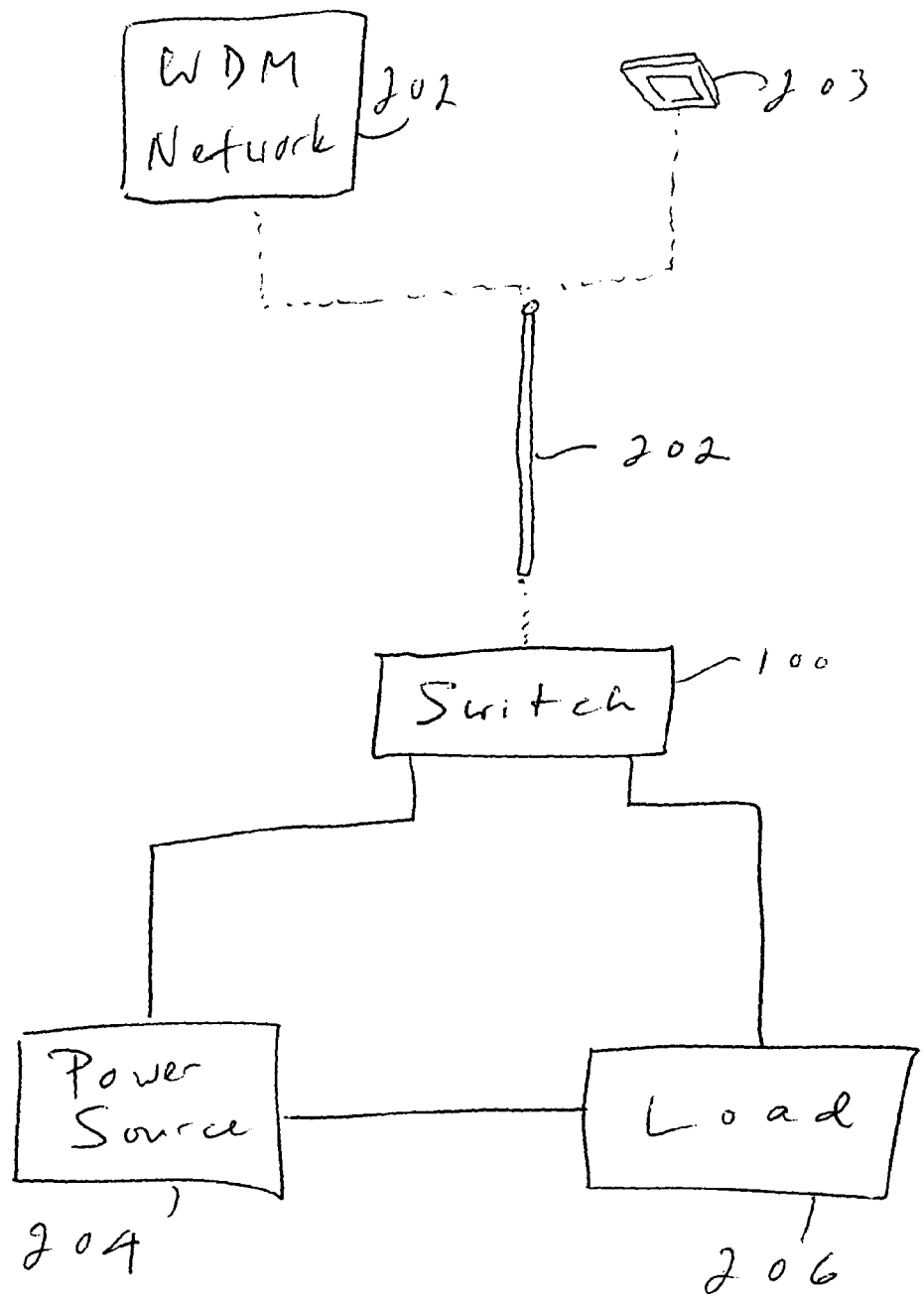
FIG. 2 is a block diagram showing a use of the switching device of FIG. 1.

FIG. 2 shows a system 200 using the switching device 100 of FIG. 1. A WDM network 202, a VCSEL device 203, or any outer suitable source sends an optical signal over an optical fiber 202 to the switching device 100. The switching device 100 responds by switching power from a power source 204 to a load 206 (e.g., a motor) in the manner just described.

While a preferred embodiment has been set forth in detail, those skilled in the art who have reviewed the present disclosure will recognize that other embodiments exist within the scope of the invention. For example, numerical values are illustrative rather than limiting, as are recitations of specific materials. Also, any power-switching topography can be used. Furthermore, embodiments can use one carbon nanotube or multiple carbon nanotubes in parallel and/or series to meet any specific need. Therefore, the present invention should be construed as limited only by the appended claims.

I claim:

1. An optically controlled power switching device for controllably switching power, the optically controlled power switching device comprising:
   a pair of terminals for the power to be switched;
   an optically controlled component for transmitting a control signal, the optically controlled component comprising a semiconducting carbon nanotube through which the control signal passes, the carbon nanotube responding to an optically generated charge near a wall of the nanotube to change its conductivity to control the control signal, wherein the optically controlled component further comprises a photosensitive element which responds to the optical signal by emitting electrons, the photosensitive element comprising a compound semiconductor that absorbs light and creates an electron-hole pair and being located such that the carbon nanotube is exposed to the electrons; and
   a power-switching component comprising either a conventional semiconductor or a wide-bandgap semiconductor element connected between the pair of terminals, the power-switching component being connected to receive the control signal from the optically controlled component to control a conductivity of the wide-bandgap semiconductor element to the power in accordance with the control signal received from the optically controlled component.

2. The device of claim 1, wherein the compound semiconductor comprises CdS.

3. The device of claim 1, wherein the compound semiconductor comprises CdSe.

4. The device of claim 1, wherein the compound semiconductor comprises a semiconductor substrate on which the carbon nanotube is disposed.

5. The device of claim 4, wherein the semiconductor substrate comprises an $SiO_2$ layer and a Si layer.

6. The device of claim 5, wherein the Si layer is a p-doped Si layer.

7. The device of claim 1, wherein the photosensitive element further comprises a photosensitive polymer.

8. The device of claim 7, wherein the photosensitive polymer is wrapped around the carbon nanotube.

9. The device of claim 1, wherein the conventional semiconductor or wide-bandgap semiconductor element comprises a first transistor whose gate is connected to the optically controlled component to receive the control signal.

10. The device of claim 9, wherein the conventional semiconductor or wide-bandgap semiconductor element comprises a second transistor whose gate is connected to an output of the first transistor.

11. The device of claim 10, wherein the first transistor is a PNP transistor, and wherein the second transistor is an NPN transistor.

12. A switching system comprising:
   (a) an optically controlled power switching device for controllably switching power, the optically controlled power switching device comprising:
   a pair of terminals for the power to be switched;
   an optically controlled component for transmitting a control signal, the optically controlled component comprising a semiconducting carbon nanotube through which the control signal passes, the carbon nanotube responding to an optically generated charge near a wall of the nanotube to change its conductivity to control the control signal, wherein the optically controlled component further comprises a photosensitive element which responds to the optical signal by emitting electrons, the photosensitive element comprising a compound semiconductor that absorbs light and creates an electron-hole pair and being located such that the carbon nanotube is exposed to the electrons; and
   a power-switching component comprising a conventional semiconductor or a wide-bandgap semiconductor element connected between the pair of terminals, the power-switching component being connected to receive the control signal from the optically controlled component to control a conductivity of the conventional semiconductor or wide-bandgap semiconductor element to the power in accordance with the control signal received from the optically controlled component;
(b) a source of the optical signal, the source of the optical signal being in optical communication with the optically controlled component;
(c) a power source; and
(d) a power load connected to the power source through the terminals.

13. The system of claim 12, wherein the source of the optical signal is connected to the optically controlled component over an optical fiber.

* * * * *